United States Patent [19]
Grabowski et al.

[11] Patent Number: 5,274,259
[45] Date of Patent: Dec. 28, 1993

[54] HIGH VOLTAGE TRANSISTOR

[75] Inventors: Wayne B. Grabowski, Mountain View; Vladimir Rumennik, Los Altos, both of Calif.

[73] Assignee: Power Integrations, Inc., Mtn. View, Calif.

[21] Appl. No.: 12,045

[22] Filed: Feb. 1, 1993

[51] Int. Cl.⁵ .................. H01L 29/68; H01L 29/10; H01L 27/01; H01L 29/40
[52] U.S. Cl. .................. 257/327; 257/344; 257/367; 257/401; 257/409
[58] Field of Search ............ 257/327, 341, 344, 365, 257/367, 368, 401, 408, 409, 411

[56] References Cited
PUBLICATIONS

Vladimir Rumennik, David L. Heald, *Integrated High and Low Voltage CMOS Technology*, IEEE 28th Int. Electron Devices Meeting, pp. 77-80, 1982.

*Primary Examiner*—Mark V. Prenty
*Attorney, Agent, or Firm*—Douglas L. Weller

[57] ABSTRACT

In a method for constructing a semiconducting device, within a substrate of a first conductivity type there is formed a well of second conductivity type. Within the well, an extended drain region of a first conductivity type is formed. An insulating region over the extended drain region is formed. A gate region is formed on a surface of the substrate. A first side of the gate region is adjacent to a first end of the extended drain region. A drain region of the first conductivity type is formed. The drain region is in contact with a second end of the extended drain region. A source region is formed on a second side of the gate region.

10 Claims, 5 Drawing Sheets

HIGH VOLTAGE TRANSISTOR

BACKGROUND

The present invention concerns a high voltage transistor used for various circuits such as amplifiers, power converters, instrumentation and the like.

In the prior art, high voltage p-channel metal-oxide-silicon (PMOS) transistor have been integrated onto circuits. See for example, the PMOS transistor disclosed by Vladimir Rumennik, David L. Heald, *Integrated High and Low Voltage CMOS Technology*, IEEE 28th Int. Electron Devices Meeting, pp. 77-80, 1982. In this prior art scheme the PMOS transistor is connected in series with an extended drain p-drift (or offset) region. P-type impurities (e.g. Boron) are introduced in the drift region by ion implantation after a polysilicon layer is formed to provide self-alignment to the gate. The charge of the p-drift region is uniquely defined by the charge matching with the underlying n-well charge. Specifically, the maximum electric field is a function of the doping level in the p-offset channel and the well and is sensitive to the charge mismatch between them. The need to control the charge in the p-drift regions requires a closely controlled Boron implant into the p-drift region.

Several difficulties exist in the above-described prior art system. For example, since the polysilicon gate is used to mask the p-type implant in the drift region, the implant energy must be limited to avoid penetrating the polysilicon. Thus, the impurity distribution in the drift region is relatively shallow. Also, only a deposited thick oxide may be used since a long thermal oxidation cycle would consume the polysilicon. The combination of a shallow diffusion in the drift region and an inferior deposited oxide leads to reduced breakdown voltages and decreased transistor reliability.

Another disadvantage is that a relatively high on-state resistance of the transistor results from the conductivity of the p-channel and the drift region being lower than the conductivity of n-channel transistors. The on-resistance of the p-channel device is significantly influenced by the net concentration of the p-type impurities. However, as discussed above, the concentration of the p-type impurities cannot be arbitrarily increased to maintain balance compensating charge as this would detrimentally affect drain break down voltage (BVD).

SUMMARY OF THE INVENTION

In accordance with the preferred embodiment of the present invention, a method for constructing a semiconducting device is presented. Within a substrate of a first conductivity type there is formed a well of second conductivity type. For example, the first conductivity type is p-type and the second conductivity type is n-type. Within the well, an extended drain region of a first conductivity type is formed.

A thick insulating region is formed over the well and extended drain regions. For example, a thick oxide layer is grown across the surface of the substrate. The thick oxide is etched to form the insulating region above the extended drain region. The etch is performed so both ends of the extended drain are exposed. A thin insulating region is formed on the surface of the substrate above the first end of the extended drain and a portion of the well. For example a thin oxide layer is grown across the surface of the substrate exposed by the prior etch.

A gate region is formed on the surface of the thin insulating region. A first side of the gate region overlaps the first end of the extended drain region. For example, this includes forming the gate region so it extends onto the thick insulating region. A drain region of the first conductivity type is formed. The drain region is in contact with the second end of the extended drain region. A source region is formed on the second side of the gate region. For example, the source region includes alternating strips of material of the first conductivity type and second conductivity type.

The preferred embodiment of the present invention is an improvement over the prior art. For example, in prior art systems, a gate is formed before implanting an extended drain region. This allows for self-alignment of the p-top region with the gate. After the implanting of the p-top region, a layer of oxide is deposited. However, in the present invention, the thick insulating region is formed before the gate region. This allows for a relatively thick (e.g. 0.8 micron) layer of field oxide to be grown over the p-top region. In the prior art, only a relatively thin (e.g. 0.1 micron) layer of field oxide could be deposited due to the limitations of the presence of the already formed polysilicon gate. Further, in the method in accordance with the preferred embodiment of the present invention the polysilicon gate is extended over the field oxide providing very efficient charge control through field plating. In the prior art, a field plate extending over the field oxide region could only be a metal layer since the polysilicon layer is formed before the field oxide regions. Such a metal field plate is much further removed from the substrate surface thus providing only partial charge control.

In an alternate embodiment of the present invention, an extended drain region of a first conductivity type is formed within a well of a second conductivity type. The well is contained within a substrate of the first conductivity type. A first insulating region is formed over a first portion of the extended drain region. A second insulating region is formed over a second portion of the extended drain region.

On a surface of the substrate a first gate region and a second gate region are formed. A first side of the first gate region is at a first end of the first portion of the extended drain region. A first side of the second gate region is at a first end of the second portion of the extended drain region.

A drain region of the first conductivity type is formed between the first portion of the extended drain region and the second portion of the extended drain region. The drain region is on a second side of the first portion of the extended drain region and is on a second side of the second portion of the extended drain region. For example, a ratio of the width of the first portion of the extended drain region to the width of the second portion of the extended drain region is at least 1:1. A first source region is formed on a second side of the first gate region. A second source region is formed on a second side of the second gate region. The first source region includes material of the first conductivity type, and the second conductivity type. The second source region includes material of the first conductivity type and the second conductivity type. This alternate embodiment has the advantage of providing an alternate current path through the well parallel to the conduction path of the first described embodiment. The advantage of the additional current path is that it provides for a decreased on-resistance of the combined structure.

DESCRIPTION OF THE PREFERRED EMBODIMENT

Figure 1:
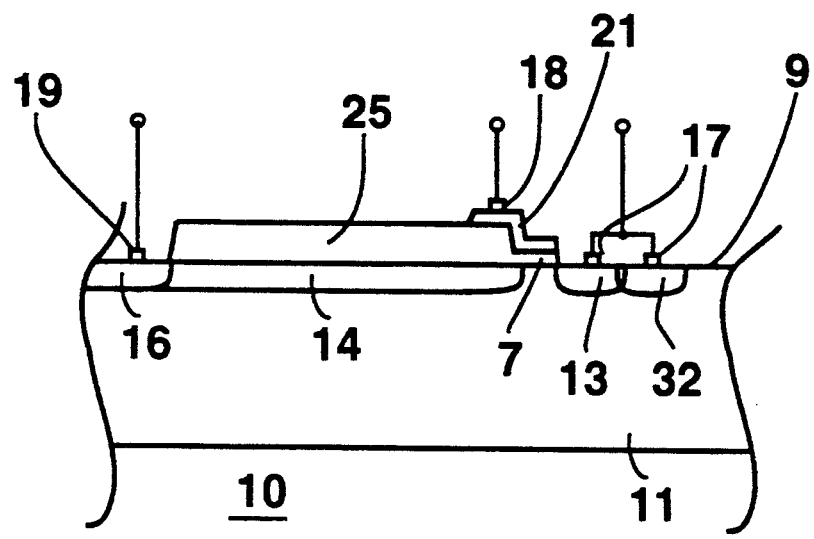
FIG. 1 shows a cross-sectional view of a high voltage transistor in accordance with a preferred embodiment of the present invention.

FIG. 1 shows a cross-sectional view of a high voltage transistor formed on a semiconductor die. A substrate 10 of a first conductivity type is, for example, made of $p^-$-type material doped with $1 \times 10^{14}$ atoms per cubic centimeter. A typical thickness of substrate 10 is 500 microns. A well 11 of material of second conductivity type is formed of, for example, n-type material doped at $4 \times 10^{12}$ to $5 \times 10^{12}$ atoms per square centimeter. Well 11 extends a depth of, for example, 5 to 10 microns below a surface 9 of the semiconductor die. The doping levels and dimensions given here and below are for a device with a breakdown voltage of approximately 100 to 1000 volts.

Within well 11, a top region 14 of first conductivity type is formed. For example, region 14 is composed of p-type material doped at $2 \times 10^{12}$ atoms per square centimeter. Top region 14 extends downward from surface 9 to a depth of, for example, 1 micron. Top region 14 functions as an extended drain region.

Over surface 9 of well 11, a layer of insulating material is grown. The insulating material is, for example, silicon dioxide which extends upward from surface 9 approximately 0.8 microns. The layer of insulating material is etched to form insulation region 25 and to expose the drain, source and channel regions.

A gate region 21 is placed over a gate insulating region 7. Gate region 21 is, for example, $n^+$ polysilicon doped at 15 ohms per square. Gate insulating region 7 is, for example, composed of silicon dioxide and extends above surface 9 approximately 200 to 1000 Angstroms.

In the prior art, the gate was formed before implanting an extended drain region. This allowed for self-alignment of the p-top region with the gate. After the implanting of the p-top region, a layer of oxide was deposited. However, the order of steps of the present invention has several significant advantages over the prior art. For example, in the present invention, a relatively thick (e.g. 0.8 micron) layer of thermally grown oxide may be formed over top regions 14. In the prior art, only a relatively thin (e.g. 0.1 micron) layer of field oxide could be deposited due to the limitations of the presence of the already formed polysilicon gate. The above described order of the steps allows the p-top region to diffuse deeper than is possible in the prior art. With a deeper p-top region the present invention can sustain higher breakdown voltages than the prior art.

Further, in the method in accordance with the preferred embodiment of the present invention, the polysilicon gate is extended over the field oxide providing very efficient charge control. However, in the prior art, a field plate extending over the field oxide region could only be a metal layer since the polysilicon layer is formed before the field oxide regions. A metal field plate is much further removed from the substrate surface thus providing only partial charge control.

Figure 2:
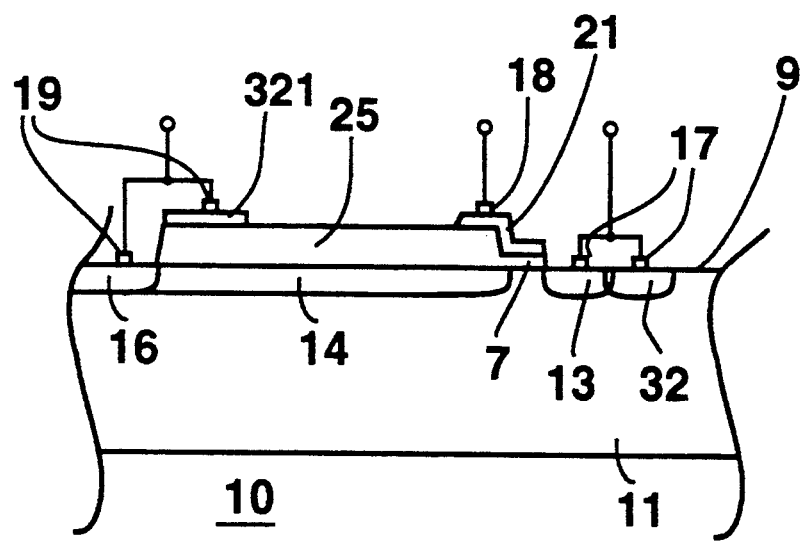
FIG. 2 shows a cross-sectional view of a high voltage transistor incorporating a field plate near the drain junction in accordance with an alternate preferred embodiment of the present invention.
Figure 3:
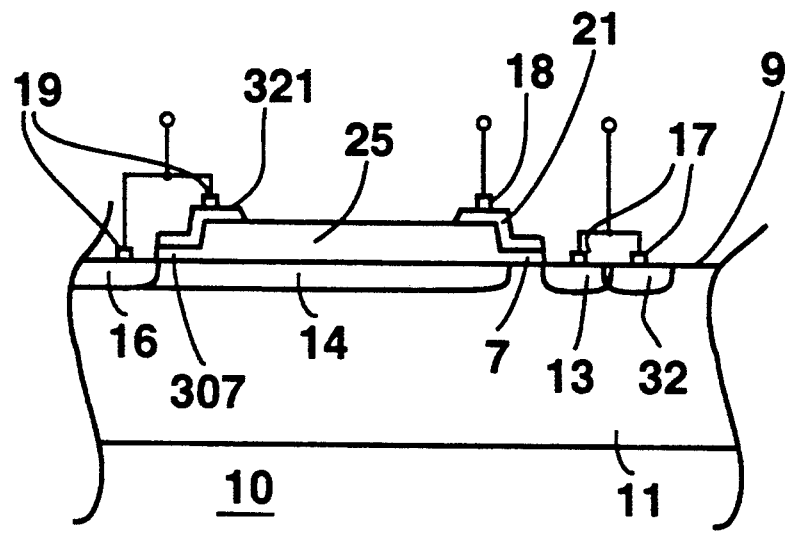
FIG. 3 shows a cross-sectional view of a high voltage transistor incorporating a stepped field plate near the drain whose height varies with position in accordance with another preferred embodiment of the present invention.

The present invention allows polysilicon field plates to be placed near the drain region. For example, FIG. 2 shows how a second gate region 321 may be placed over thick insulating region 25 near drain contact region 16. Gate region 321 is, for example, $n+$ polysilicon doped at 15 ohms per square. FIG. 3 shows how the height of the drain field plating may be varied by introducing a thin insulating region 307 under gate region 321. Insulating region 307 is, for example, silicon dioxide and extends above surface 9 approximately 200 to 1000 Angstroms. Drain field plates provide additional charge control near the drain junction.

In the preferred embodiment, after forming gate region 21, within well 11, a source contact region 13 of first conductivity type and a drain contact region 16 of first conductivity type are implanted. For example, source contact region 13 and drain contact region 16 each are composed of $p^+$-type material doped at $2 \times 10^{15}$ atoms per square centimeter. Source contact region 13 and drain contact region 16, for example, each extend 0.6 microns below surface 9 of the semiconductor die. Drain contact region 16 is in direct contact with top region 14.

Additionally, a source contact region 32 of second conductivity type is implanted. Source contact region 32 is, for example, composed of $n^+$-type material doped at $5 \times 10^{15}$ atoms per square centimeter. Source contact region 32 extends, for example, 0.6 microns below surface 9 of the semiconductor die. Source contact region 13 and source contact region 32 are representative of the "chopped" source of alternating layers of $p^+$-type material and $n^+$-type material, as discussed below.

A source contact 17 is placed on surface 9 in electrical contact with source contact region 13 and source contact 32. A drain contact 19 is placed in electrical contact with drain contact region 16 (and for the embodiments shown in FIG. 2 and FIG. 3, in contact with field plate 321). A gate contact 18 is placed in electrical contact with gate region 21. Metalization and passivation steps then are performed as is understood in the art.

Figure 4:
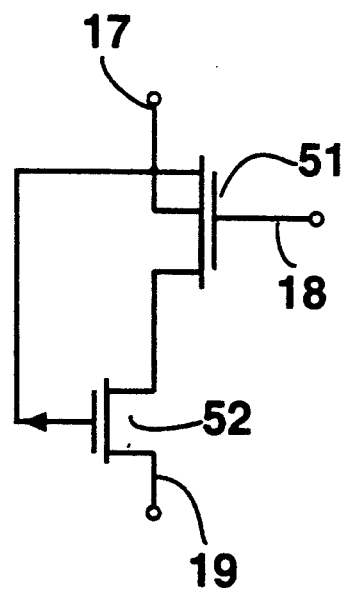
FIG. 4 shows an equivalent circuit representation of the high voltage transistor shown in FIG. 1 in accordance with a preferred embodiment of the present invention.

FIG. 4 shows an equivalent circuit representation of the high voltage structure shown in FIG. 1. The high voltage structure functions as a MOSFET 51 connected in series with a JFET 52. The channel for JFET 52 is top region 14. The gate for JFET 52 is tied to the source for MOSFET 51 via well 11. JFET 52 contributes significantly to the on-resistance of the combined structure especially at high applied voltages.

Figure 5:
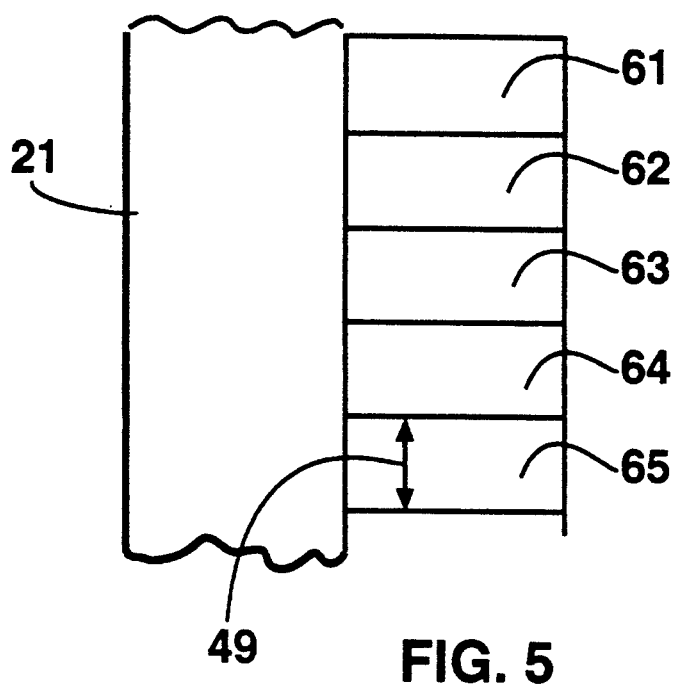
FIG. 5 shows a top view of a source region utilized for the high voltage transistor shown in FIG. 1 in accordance with a preferred embodiment of the present invention.

As shown in FIG. 5, to further enhance the device avalanche capability the source of the device is arranged in an order of alternate n+ layers 61, 63, 65 and p+ layers 62, 64. Each layer has a width 49 of, for example, 3 microns.

Figure 6:
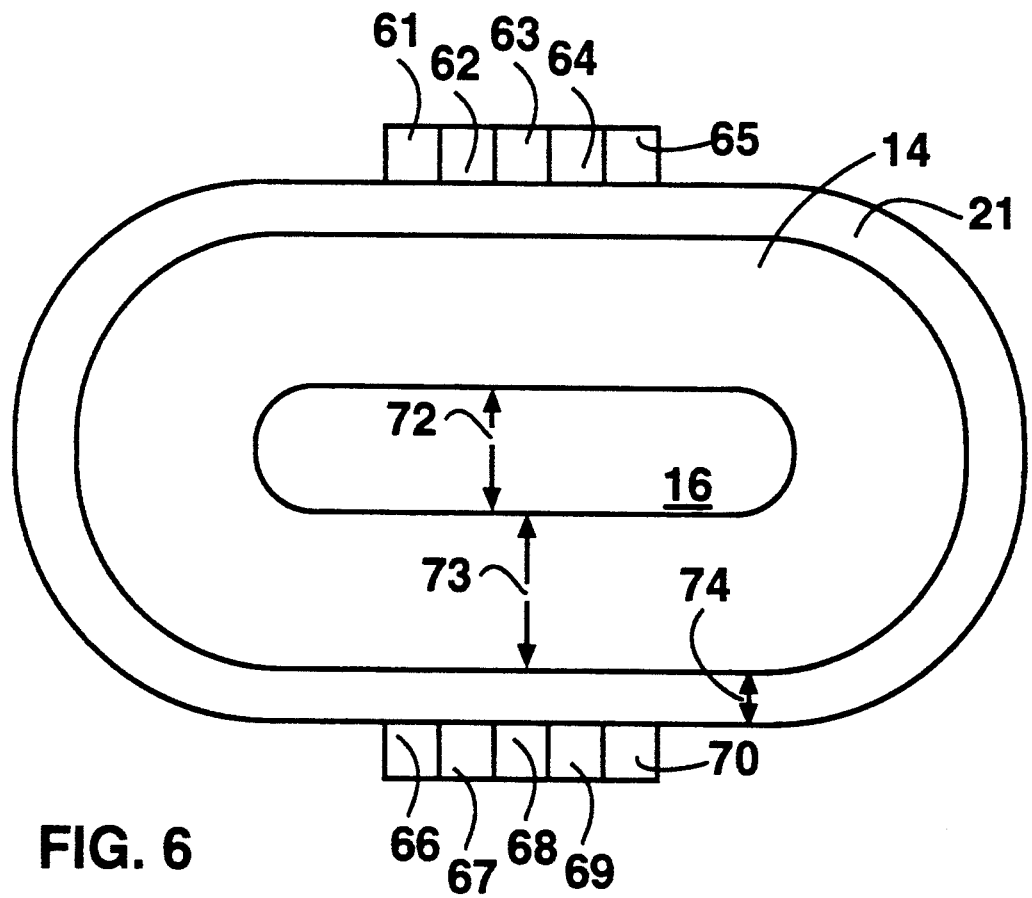
FIG. 6 shows a simplified top view of the high voltage transistor shown in FIG. 1 in accordance with a preferred embodiment of the present invention.

FIG. 6 shows a simplified top view of the high voltage transistor shown in FIG. 1. The high voltage transistor is shown in FIG. 6 to have a "chopped source" consisting of alternate n+ layers 61, 63, 65, 67, 69 and p+ layers 62, 64, 66, 68, 70. Drain contact region 16 has a height 72 of, for example, 10 to 100 microns. Top region 14 has a width 73 of, for example 20 to 40 microns. Gate region 21 has a width 74 of, for example, 6 microns.

Figure 7:
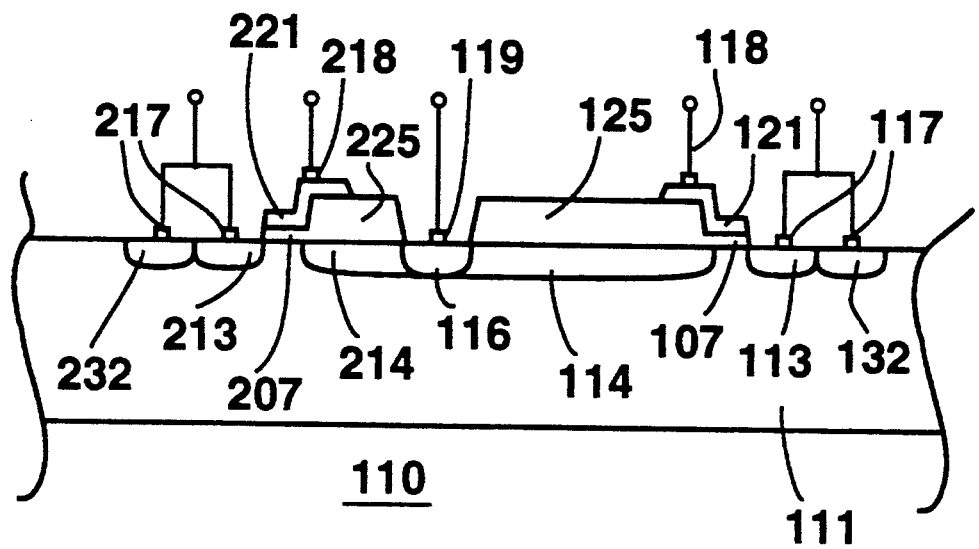
FIG. 7 shows a cross-sectional view of a high voltage transistor in accordance with an alternate preferred embodiment of the present invention.

FIG. 7 shows a cross-sectional view of an alternate preferred embodiment of a high voltage transistor formed on a semiconductor die. The alternate embodiment provides a new structure in which an alternate current path is introduced in parallel to the main MOSFET and JFET combination thus decreasing the on-resistance of the combined structure.

As shown by FIG. 7, a substrate 110 of first conductivity type is, for example, made of p−-type material doped with $1 \times 10^{14}$ atoms per cubic centimeter. A typical thickness of substrate 110 is 500 microns. A well 111 of material of second conductivity type is formed of, for example, n-type material doped at $4 \times 10^{12}$ to $5 \times 10^{12}$ atoms per square centimeter. Well 111 extends a depth of, for example, 5 to 10 microns below a surface 109 of the semiconductor die. The doping levels and dimensions given here and below are for a device with a breakdown voltage of approximately 100 to 1000 volts.

Within well 111, a top region 114 of first conductivity type and a top region 214 of first conductivity type are formed. For example, region 114 and region 214 are composed of p-type material doped at $2 \times 10^{12}$ atoms per square centimeter. Region 114 and region 214 each extend downward from surface 109 to a depth of, for example, 1 micron.

Over surface 109 of well 111, a layer of insulating material is grown. The insulating material is, for example, silicon dioxide which extends upward from surface 109 approximately 0.8 microns. The layer of insulating material is etched to form insulation region 125, to form insulation region 225 and to expose the drain, source and channel regions.

A gate region 121 is placed over a gate insulating region 107. Likewise, a gate region 221 is placed over a gate insulating region 207. Gate region 121 and gate regions 221 are, for example, n+ polysilicon doped at 15 ohms per square. Gate insulating regions 107 and 207 are, for example, composed of silicon dioxide and each extend above surface 109 approximately 200 to 1000 Angstroms.

Within well 111, a source contact region 113 of first conductivity type, a source contact region 213 of first conductivity type and a drain contact region 116 of first conductivity type are implanted. For example, source contact region 113, source contact region 213 and drain contact region 116 each are composed of p+-type material doped at $2 \times 10^{15}$ atoms per square centimeter. Source contact region 113, source contact region 213 and drain contact region 116, for example, each extend 0.6 microns below surface 109 of the semiconductor die. Additionally, a source contact region 132 and a source contact region 232 of second conductivity type are implanted. Source contact regions 132 and 232 are, for example, composed of n+-type material doped at $5 \times 10^{15}$ atoms per square centimeter. Source contact regions 132 and 232 each extend, for example, 0.6 microns below surface 109 of the semiconductor die. Source contact regions 113, 132, 213 and 232 are representative of "chopped" sources of alternating layers of p+-type material and n+-type material.

Source contacts 117 are placed on surface 109 in electrical contact with source contact region 113 and source contact 132. Source contacts 217 are placed on surface 109 in electrical contact with source contact region 213 and source contact 232. A drain contact 119 is placed on surface 109 in electrical contact with drain contact region 116. A gate contact 118 is placed in electrical contact with gate region 121. A gate contact 218 is placed in electrical contact with gate region 221. Metalization and passivation steps then are performed as is understood in the art.

Figure 8:
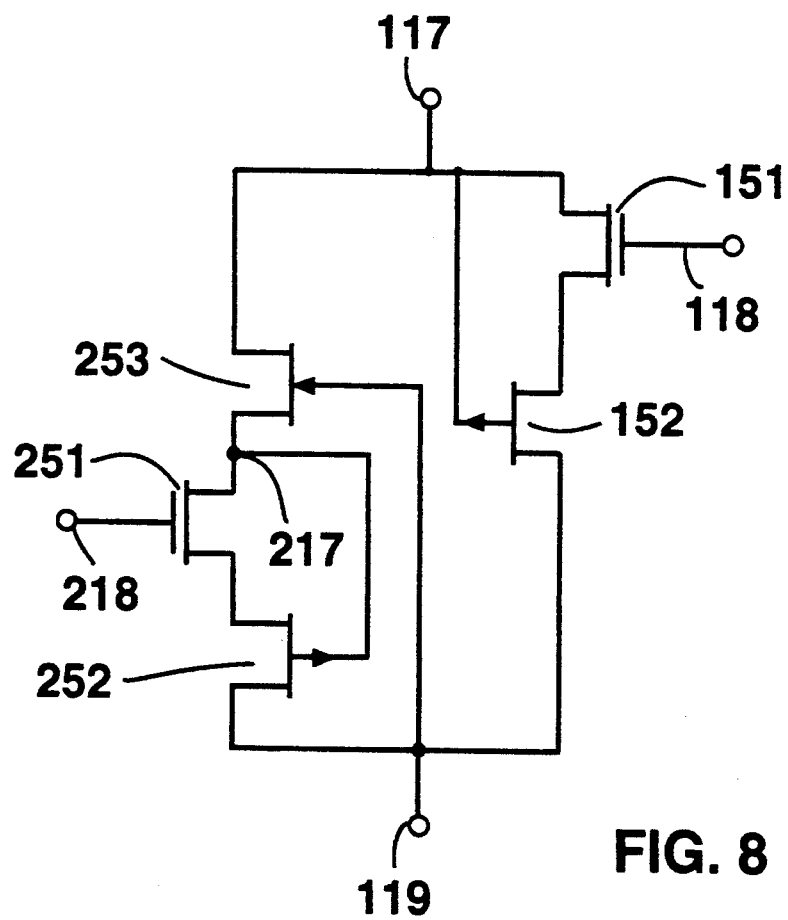
FIG. 8 shows an equivalent circuit representation of the high voltage transistor shown in FIG. 7 in accordance with the alternate preferred embodiment of the present invention.

FIG. 8 shows an equivalent circuit representation of the high voltage structure shown in FIG. 7. A main MOSFET 151 is connected in series with a JFET 152. The channel for JFET 152 is top region 114. The gate for JFET 152 is tied to the source for MOSFET 151 via well 111. In parallel with MOSFET 151 and JFET 152, is an auxiliary MOSFET 251 connected in series with a JFET 252 and a JFET 253. The channel for JFET 253 is well 111. The gate for JFET 253 is top regions 114 and 214 and drain contact region 116.

In the preferred embodiment, JFET 253 is a high voltage n-channel JFET with a breakdown voltage of, for example, 100 to 1000 volts. MOSFET 251 and JFET 252 together represent an auxiliary p-channel MOSFET with a breakdown voltage of, for example, 20 to 100 volts. The auxiliary MOSFET 251 and JFET 252 are formed within the drain of high voltage MOSFET 151. The portion of well 111 to which the source of auxiliary MOSFET 251 is connected is completely surrounded by top region 214, drain contact region 116 and top region 114 which together constitute the gate for JFET 253. When the voltage applied between source 117 and drain 116 exceeds the threshold voltage for JFET 253 the channel of JFET 253 will pinch off. The voltage applied to the auxiliary MOSFET 251 and JFET 252 combination is thus limited to the threshold voltage of JFET 253 which is, for example, 20 to 100 volts.

The combined structure shown in FIGS. 7 and 8 has two gates and two current paths. If the main MOSFET 151 is turned on, current will flow through the PMOS channel under gate 121 and top drift region 114 to drain 116. If auxiliary MOSFET 251 is turned on, current will flow through well 111 to source contact 232 then continue through the PMOS channel under gate 221 and top drift region 214 to drain 116. Both paths may be activated simultaneously provided the gate to channel junction (the junction between well 111 and top regions 114, 214 and drain 116) of JFET 253 is not forward biased.

Figure 9:
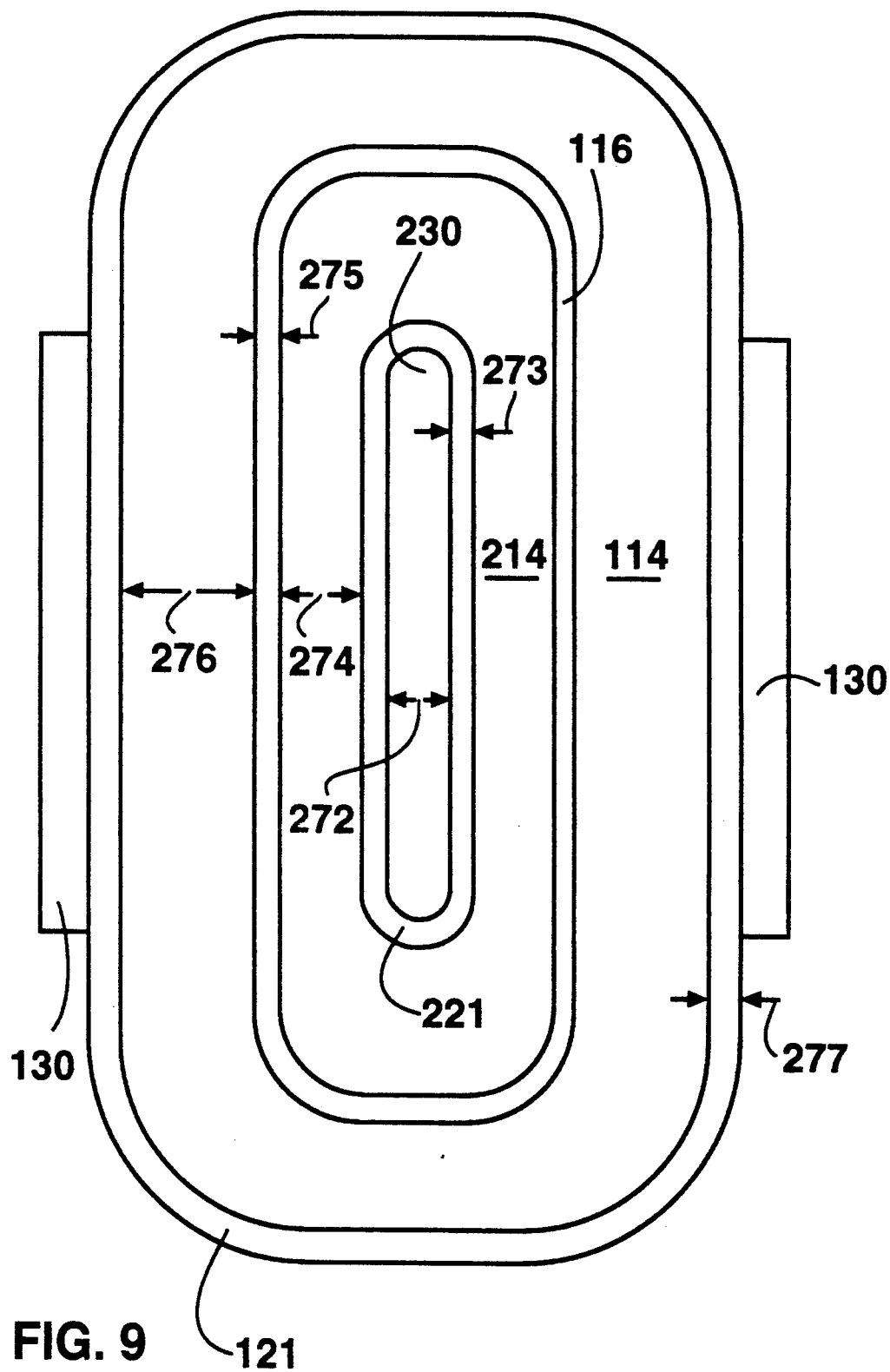
FIG. 9 shows a simplified top view of the high voltage transistor shown in FIG. 7 in accordance with the alternate preferred embodiment of the present invention.

FIG. 9 shows a simplified top view of the high voltage structure shown in FIG. 7. An area 230 contains a "chopped source" for MOSFET 251. Area 230 consists of alternate n+ layers and p+ layers. Area 230 has a length 272 of, for example, 7 to 14 microns. Gate region 221 surrounds area 230 and has a width 273 of, for example 6 microns. Top region 214 separates gate region 221 from drain region 116 a distance 274 of, for example 5 to 10 microns. Drain region 116 has a width 275 of, for example, 5 to 10 microns. Top region 114 separates gate region 121 from drain region 116 a distance 276 of, for example 20 to 40 microns for 400 volt operation. Area 130 contains a "chopped source" for MOSFET 151. Area 130 consists of alternate n+ layers and p+ layers. Gate region 121 surrounds area 130 and has a width 277 of, for example 6 microns.

The foregoing discussion discloses and describes merely exemplary methods and embodiments of the present invention. As will be understood by those familiar with the art, the invention may be embodied in other specific forms without departing from the spirit or essential characteristics thereof. For example, the examples given above are for p-channel devices; however, an n-channel device can be also implemented using the reverse conduction type construction fabricated in n-type substrates. Accordingly, the disclosure of the present invention is intended to be illustrative, but not limiting, of the scope of the invention, which is set forth in the following claims.

We claim:
1. A semiconductor device comprising:
   a substrate of a first conductivity type;
   a well of a second conductivity type within the substrate;
   a first extended drain region of the first conductivity type formed within the well;
   a second extended drain region of the first conductivity type formed within the well;
   a first insulating region over the first extended drain region;
   a second insulating region over the second extended drain region;
   a first gate region formed on a surface of the substrate, a first side of the first gate region located over a first end of the first extended drain region;
   a second gate region formed on the surface of the substrate, a first side of the second gate region located over a first end of the second extended drain region;
   a drain region of the first conductivity type formed within the well between the first extended drain region and the second extended drain region, the drain region being in contact with a second side of the first extended drain region and being in contact with a second side of the second extended drain region;
   a first source region formed in the well on a second side of the first gate region, the first source region comprising a first conductivity subregion and a second conductivity subregion shorted to the first conductivity subregion; and,
   a second source region formed in the well on a second side of the second gate region, the second source region comprising a first conductivity subregion shorted to a second conductivity subregion.
2. A semiconductor device as in claim 1 wherein the first gate region extends over the first insulating region and the second gate region extends over the second insulating region.

3. A semiconductor device as in claim 1 wherein the first source regions includes strips of material of alternately the first conductivity type and the second conductivity type and wherein the second source region includes strips of material of alternately the first conductivity type and the second conductivity type.
4. A semiconductor device as in claim 1 wherein a ratio of a width of the first extended drain region to a width of the second extended drain region is at least 1:1.
5. A semiconductor device as in claim 1 wherein the first conductivity type is p-type and the second conductivity type is n-type.
6. A semiconductor device comprising:
   a substrate;
   a first conductivity type substrate region within the substrate;
   a first extended drain region of a second conductivity type formed within the first conductivity type substrate region;
   a second extended drain region of the second conductivity type formed within the first conductivity type substrate region;
   a first insulating region over the first extended drain region;
   a second insulating region over the second extended drain region;
   a first gate region formed on a surface of the substrate, a first side of the first gate region located over a first end of the first extended drain region;
   a second gate region formed on the surface of the substrate, a first side of the second gate region located over a first end of the second extended drain region;
   a drain region of the second conductivity type formed within the first conductivity type substrate region between the first extended drain region and the second extended drain region, the drain region being in contact with a second side of the first extended drain region and being in contact with a second side of the second extended drain region;
   a first source region formed in the first conductivity type substrate region on a second side of the first gate region, the first source region comprising a second conductivity type subregion and a first conductivity type subregion shorted to the second conductivity type subregion; and,
   a second source region formed in the first conductivity type substrate region on a second side of the second gate region, the second source region comprising a second conductivity type subregion shorted to a first conductivity type subregion.
7. A semiconductor device as in claim 6 wherein the first gate region extends over the first insulating region and the second gate region extends over the second insulating region.
8. A semiconductor device as in claim 6 wherein the first source regions includes strips of material of alternately the second conductivity type and the first conductivity type and wherein the second source region includes strips of material of alternately the second conductivity type and the first conductivity type.
9. A semiconductor device as in claim 6 wherein a ratio of a width of the first extended drain region to a width of the second extended drain region is at least 1:1.
10. A semiconductor device as in claim 6 wherein the second conductivity type is p-type and the first conductivity type is n-type.

* * * * *